(12) United States Patent
Koga et al.

(10) Patent No.: US 7,808,935 B2
(45) Date of Patent: Oct. 5, 2010

(54) DUPLEXER AND COMMUNICATION DEVICE

(75) Inventors: Wataru Koga, Kyoto (JP); Takeshi Takenoshita, Kyoto (JP); Takanori Ikuta, Kyoto (JP)

(73) Assignee: Kyocera Corporation, Kyoto (JP)

( * ) Notice: Subject to any disclaimer, the term of this patent is extended or adjusted under 35 U.S.C. 154(b) by 34 days.

(21) Appl. No.: 12/281,975

(22) PCT Filed: Mar. 7, 2007

(86) PCT No.: PCT/JP2007/054482

§ 371 (c)(1),
(2), (4) Date: Oct. 24, 2008

(87) PCT Pub. No.: WO2007/102560

PCT Pub. Date: Sep. 13, 2007

(65) Prior Publication Data

US 2009/0147707 A1    Jun. 11, 2009

(30) Foreign Application Priority Data

Mar. 8, 2006    (JP)    ............................. 2006-063091

(51) Int. Cl.
H04B 1/44    (2006.01)
H11P 5/12    (2006.01)

(52) U.S. Cl. ...................................... 370/282; 333/132

(58) Field of Classification Search ................. 370/275, 370/282

See application file for complete search history.

(56) References Cited

U.S. PATENT DOCUMENTS

| | | | |
|---|---|---|---|
| 5,923,647 A * | 7/1999 | Dolman et al. .............. 370/280 |
| 6,747,527 B2 * | 6/2004 | Nakamura et al. .......... 333/126 |
| 6,822,537 B1 | 11/2004 | Taniguchi et al. | |
| 6,862,313 B2 * | 3/2005 | Walley et al. ............... 375/141 |
| 7,030,716 B2 * | 4/2006 | Tsutsumi et al. ............ 333/133 |
| 7,130,590 B2 * | 10/2006 | McDonald et al. ........... 455/80 |
| 2003/0020562 A1 | 1/2003 | Ikada et al. | |
| 2003/0076196 A1 * | 4/2003 | Nakamura et al. .......... 333/134 |
| 2004/0212452 A1 * | 10/2004 | Tsutsumi et al. ............ 333/133 |
| 2004/0246071 A1 * | 12/2004 | Rottmoser et al. .......... 333/134 |
| 2006/0052066 A1 * | 3/2006 | Cleveland et al. ........... 455/101 |

(Continued)

FOREIGN PATENT DOCUMENTS

JP    H05-075374    3/1993

(Continued)

*Primary Examiner*—Andrew Lee
(74) *Attorney, Agent, or Firm*—Birch, Stewart, Kolasch & Birch, LLP

(57) ABSTRACT

Provided is a demultiplexer capable of improving attenuation characteristic and isolation characteristic of a filter having a lower transmission frequency band among two filters having different transmission frequency bands, outside the transmission frequency band of a high-frequency side. A communication device using the demultiplexer is also disclosed. A first spiral wiring portion (55) and a sixth wiring portion (56) are formed so that an angle defined by a direction of a part (L1) of the first spiral wiring portion (55) and a direction of a part (L2) of the sixth spiral wiring portion (56) on a predetermined virtual plane is, for example, 0 degree and the direction of the current flowing in the part (L1) of the first spiral wiring portion (55) is opposite to the direction of the current flowing in the part (L2) if the sixth wiring portion (56).

4 Claims, 9 Drawing Sheets

U.S. PATENT DOCUMENTS

| | | | |
|---|---|---|---|
| 2006/0103485 A1* | 5/2006 | Okuyama et al. | 333/132 |
| 2006/0128336 A1* | 6/2006 | Waltman et al. | 455/273 |
| 2008/0242235 A1* | 10/2008 | Adler et al. | 455/73 |
| 2009/0086655 A1* | 4/2009 | Ghadaksaz | 370/293 |

FOREIGN PATENT DOCUMENTS

| | | |
|---|---|---|
| JP | 2004-080233 A | 3/2004 |

* cited by examiner

DUPLEXER AND COMMUNICATION DEVICE

This application is the national stage of International Application PCT/JP2007/054482, filed Mar. 7, 2007, which claims priority under 35 USC §119(a)-(d) of Japanese Application No. 2006-063091, filed Mar. 8, 2006.

TECHNICAL FIELD

The present invention relates to a duplexer including a plurality of filters having different passbands and to a communication device including the same.

BACKGROUND ART

Regarding filters for use in mobile communication terminals, miniaturization and weight reduction are desired. Furthermore, it is desired that the filters have a small loss at a passband and large attenuation at a frequency band outside of the passband (hereinafter, referred to as a non-passband frequency band) and have a sharp frequency-characteristic change at a boundary between the passband and the non-passband frequency band.

In addition, regarding duplexers that separate signals of a transmission frequency band from signals of a reception frequency band, miniaturization and weight reduction are desired. Transmission filters used in the duplexers are desired to have a low loss at a transmission frequency band and large attenuation at a reception frequency band and to have a sharp frequency-characteristic change at a boundary between the transmission frequency band and the reception frequency band. Reception filters used in the duplexers are desired to have a low loss at the reception frequency band and large attenuation at the transmission frequency band and to have a sharp frequency-characteristic change at a boundary between the reception frequency band and the transmission frequency band. Furthermore, it is desired that the duplexers have a preferable isolation characteristic between a transmission terminal and a reception terminal.

Duplexers including dielectric resonator filters had been used. However, due to a demand for miniaturization, duplexers including surface acoustic wave (SAW) filters and duplexers including film bulk acoustic resonator (FBAR) filters are used.

As disclosed in Japanese Unexamined Patent Application Publication No. 2002-176337, striplines, distributed-constant lines, and chip components such as a chip inductor and a chip capacitor are arranged between a transmission filter and a reception filter as a matching circuit in a known SAW-filter-including duplexer in order to adjust impedance of the transmission filter and the reception filter. According to Japanese Unexamined Patent Application Publication No. 2002-176337, since the matching circuit is arranged between the transmission filter and the reception filter, sufficient miniaturization is not achieved.

In Japanese Unexamined Patent Application Publication No. 2004-336181, a SAW device having excitation electrodes arranged on a piezoelectric substrate is mounted at a cavity portion of a package main body. The electrode patterns arranged on the piezoelectric substrate are connected to terminals of the package using a wire boding technique and the cavity portion is sealed with a cap or the like, whereby a SAW filter is created. The SAW filter is miniaturized by including a matching circuit in the package main body.

In this case, an inductance component of a bonding wire is effectively used by connecting parallel arms forming the SAW device and the terminals of the package using the bonding wire, whereby an attenuation characteristic can be improved at a non-passband frequency band of the SAW filter.

To further miniaturize the package, a reduction in a space and a height needed for wire bonding by employing flipchip mounting of a SAW device, which is formed on a substrate, on a circuit board positively using a chip size package (CSP) technology has been suggested. Since an inductance component constituted by a bonding wire no longer exists in the flipchip mounting, an attenuation characteristic can be improved at a non-passband frequency band by providing a line having an inductance component on the circuit board. According to Japanese Unexamined Patent Application Publication No. 2003-198325, a matching circuit and a line having an inductance component are arranged in a package main body so that interference is not caused between the matching circuit and the line. More specifically, the matching circuit is formed in an inner layer of the package, whereas the line having the inductance component is routed apart from the matching circuit and is connected to a ground through a castellation arranged at a package outer periphery. In addition, a ground layer is arranged over the matching circuit to suppress interference between the matching circuit and other circuits. Accordingly, sufficient height reduction and miniaturization are not achieved.

FIG. 11 is a diagram showing a configuration of a duplexer 1 according to the related art. A known duplexer 1 includes a first filter 2 and a second filter 3, which have different passbands. The first and the second filters 2 and 3 are connected to a common node P. An antenna terminal 4 is also connected to the common node P. For example, suppose that the first filter 2 is a filter (hereinafter, referred to as a "TX filter 2") that passes signals of a transmission frequency band, whereas the second filter 3 is a filter (hereinafter, referred to as a "RX filter 3") that passes signals of a reception frequency band. In that case, a transmission signal supplied to a transmission signal terminal 5 from a transmission circuit, not shown, is supplied to an antenna, not shown, through the antenna terminal 4 after propagating through the TX filter 2 and is transmitted to another communication device. In addition, a reception signal received by the antenna and input to the antenna terminal 4 is supplied to a reception circuit, not shown, from a reception signal terminal 6 after propagating through the RX filter 3.

In the duplexer 1, for example, part of the transmission signal supplied from the transmission circuit to the transmission signal terminal 5 passes through the TX filter 2 and leaks to the RX filter 3 from the common node P. Accordingly, a matching circuit 7 is provided between the antenna terminal 4 and the filters 2 and 3, more particularly, between the antenna terminal 4 and the common node P. The matching circuit 7 can adjust impedance so that impedance of the transmission circuit from the antenna terminal 4 reaches an infinite value at the reception frequency band and that impedance of the reception circuit from the transmission circuit reaches an infinite value at the transmission frequency band.

Techniques according to the related art employ a method for providing a wire and a line having an inductance component between parallel arms forming a SAW device and a ground to miniaturize a SAW filter and keep a preferable attenuation characteristic at a non-passband frequency band. Duplexers also employ the above-described techniques to improve an attenuation characteristic and an isolation characteristic at a non-passband frequency band. However, unlike duplexers manufactured using the wire bonding technique, duplexers manufactured using the CSP technology cannot use a bonding wire having an inductance component. Thus, a line having an inductance component has to be provided on a circuit board.

Nevertheless, since input/output electrodes, a ground electrode, and a matching circuit are arranged on the circuit board constituting a duplexer, it is undesirably difficult to provide a sufficiently long line having an inductance component, due to which desired attenuation and isolation characteristics cannot be satisfied.

DISCLOSURE OF THE INVENTION

It is an object of the present invention to provide a duplexer capable of improving an attenuation characteristic and an isolation characteristic at a higher non-passband frequency band of a filter having a lower passband out of two filters having different passbands and a communication device including the same.

According to the present invention, a duplexer comprises a first filter having a first signal input portion, a first signal output portion and a first ground portion connected to a parallel arm including at least one of a resonator and a capacitor and has a predetermined passband; a second filter having a second signal input portion, a second signal output portion and a second ground portion, and having a passband higher than the passband of the first filter; a common terminal connected to the first signal output portion and the second signal input portion; a first interconnection connected to the first signal output portion and the second signal input portion; a second interconnection connected to the first ground portion; and a ground terminal connected to the first and second interconnections and the second ground portion and to be supplied with a ground potential. The first and second interconnections are formed so that one of angles between an extending direction of part of the first interconnection and an extending direction of part of the second interconnection on a predetermined virtual plane is smaller than 90 degrees and a direction of current flow through the part of the first interconnection is opposite to a direction of current flow through the part of the second interconnection.

In addition, in the present invention, the duplexer further comprises a multilayer interconnection substrate in which the first filter, the second filter, the common terminal, the first interconnection, the second interconnection, and the ground terminal are provided. The part of the first interconnection and the part of the second interconnection are formed on an identical layer of the multilayer interconnection substrate.

Furthermore, in the present invention, the part of the first interconnection and the part of the second interconnection are formed on different layers of the multilayer interconnection substrate.

According to the present invention, a communication device comprises a duplexer described above; an antenna connected to the common terminal; and a transmission/reception processing unit that supplies a signal to the first signal input portion and is supplied with a signal from the second signal output portion.

According to the present invention, the first filter has a first signal input portion, a first signal output portion, and a first ground portion connected a parallel arm including at least one of a resonator and a capacitor and has a predetermined passband. The second filter has a second signal input portion, a second signal output portion, and a second ground portion and has a passband higher than the passband of the first filter. The first signal output portion and the second signal input portion are connected to the common terminal. The first interconnection is connected to the first signal output portion and the second signal input portion. The second interconnection is connected to the first ground portion. The ground terminal is connected to the first and second interconnections and the second ground portion and they are supplied with a ground potential. The first and second interconnections are formed so that one of angles between an extending direction of part of the first interconnection and an extending direction of part of the second interconnection on a predetermined virtual plane is smaller than 90 degrees and that a direction of a current flowing through the part of the first interconnection is opposite to a direction of a current flowing through the part of the second interconnection. Here, a state in which a direction of a current flowing through part of a first interconnection is opposite to a direction of a current flowing through part of a second interconnection equates to a state in which a direction of magnetic fluxes around the part of the first interconnection is opposite to a direction of magnetic fluxes around the part of the second interconnection.

An approach of the part of the first interconnection to the part of the second interconnection increases mutual inductive coupling, which cancels the magnetic fluxes since the direction of the current flowing through the part of the first interconnection is opposite to the direction of the current flowing through the part of the second interconnection, namely, since the direction of the magnetic fluxes around the part of the first interconnection is opposite to the direction of the magnetic fluxes around the part of the second interconnection. Therefore, the inductance of the second interconnection apparently decreases.

At least one of a resonator and a capacitor constituting a parallel arm of a first filter, the mutual inductance formed by the part of the first interconnection and the part of the second interconnection, and the inductance of the second interconnection constitute a series resonant circuit. An increase in the mutual inductance formed by the part of the first interconnection and the part of the second interconnection increases the mutual inductive coupling, which increases a resonance frequency of the series resonant circuit since the direction of the current flowing through the part of the first interconnection is opposite to the direction of the current flowing through the part of the second interconnection.

By forming the first and second interconnections in a manner described above, it is possible to resonate the series resonant circuit at a higher-side frequency band that is outside of a passband (hereinafter, referred to as a higher non-passband frequency band) of the first filter, whereby an attenuation pole can be provided relatively easily. Since this can increase attenuation at the higher non-passband frequency band of the first filter, an attenuation characteristic can be improved. Furthermore, since the attenuation can be increased at the higher non-passband frequency band of the first filter, it is possible to improve an isolation characteristic at the higher non-passband frequency band of the first filter.

According to the present invention, a first filter, a second filter, a common terminal, a first interconnection, a second interconnection, and a ground terminal may be provided in a multilayer interconnection substrate. The part of the first interconnection and the part of the second interconnection may be formed on an identical layer of the multilayer interconnection substrate. Accordingly, the number of layers can be decreased in comparison with a case where the part of the first interconnection and the part of the second interconnection are formed on different layers of the multilayer interconnection substrate. Thus, the multilayer interconnection substrate can be miniaturized in the thickness direction thereof.

According to the present invention, the part of the first interconnection and the part of the second interconnection may be formed on different layers of the multilayer interconnection substrate. This can decrease a size of one surface of a layer perpendicular to the thickness direction of the multilayer interconnection substrate in comparison with a case where the part of the first interconnection and the part of the second interconnection are formed on an identical layer of the multilayer interconnection substrate. In this manner, the multilayer interconnection substrate can be miniaturized in a direction perpendicular to the thickness direction of the multilayer interconnection substrate.

According to the present invention, an antenna may be connected to the common terminal. A transmission/reception processing unit supplies a signal to a first signal input portion of a duplexer, thereby transmitting the signal to another communication device through the antenna connected to the common terminal. The transmission/reception processing unit also receives a signal supplied from a second signal output portion of the duplexer, thereby receiving the signal transmitted from another communication device. Since the communication device includes a duplexer capable improving an attenuation characteristic and an isolation characteristic at a higher non-passband frequency band of the first filter, a communication device capable of transmitting/receiving high-quality signals without transmitting/receiving unnecessary signals of the non-passband frequency band can be realized.

BRIEF DESCRIPTION OF THE DRAWINGS

Objects, features, and advantages of the present invention will become apparent from the detailed description and the attached drawings given below.

BEST MODE FOR CARRYING OUT THE INVENTION

Preferred embodiments of the present invention will be described in detail below with reference to the attached drawings.

Figure 1:
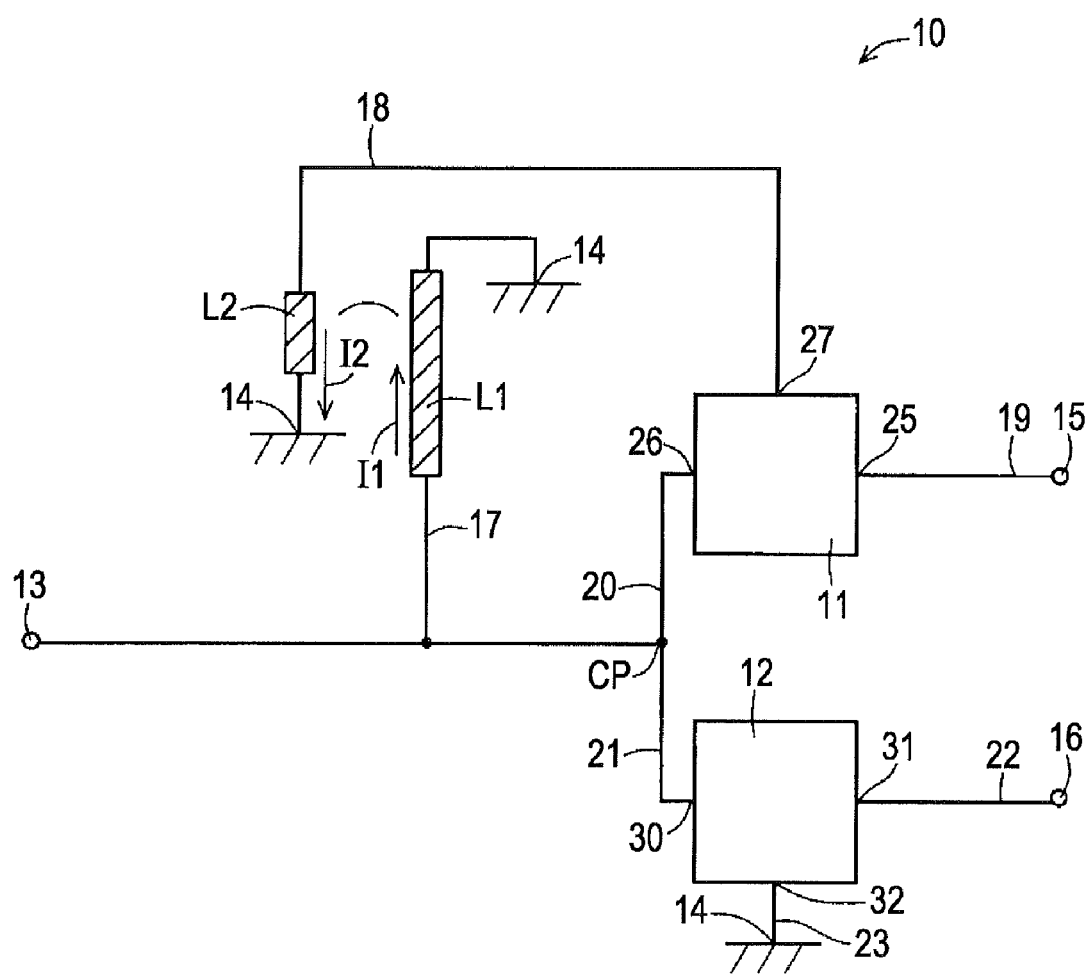
FIG. 1 is a diagram showing a configuration of a duplexer 10 according to a first embodiment of the present invention.
Figure 2:
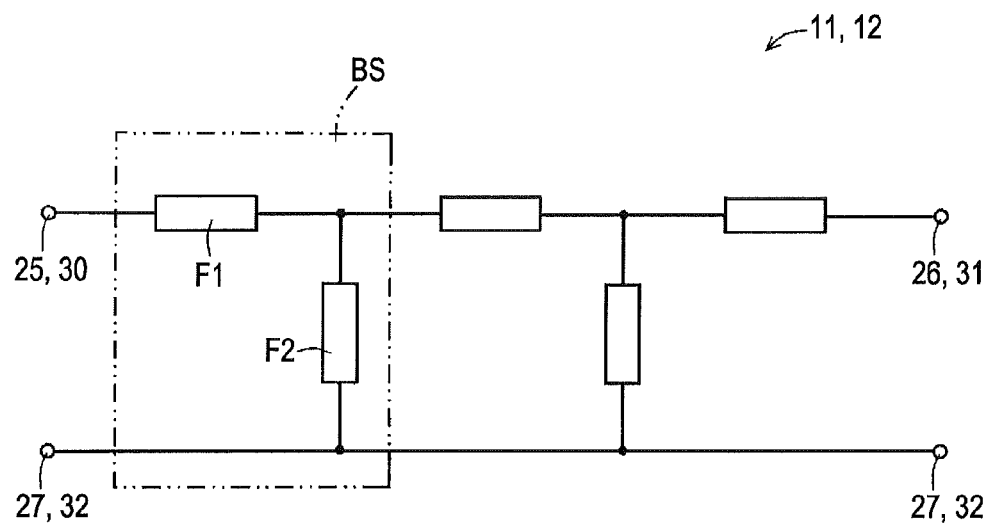
FIG. 2 is a diagram showing a configuration of first and second filters 11 and 12.

FIG. 1 is a diagram showing a configuration of a duplexer 10 according to a first embodiment of the present invention. FIG. 2 is a diagram showing a configuration of first and second filters 11 and 12. A duplexer 10 is disposed between an antenna (not shown) and a transmission/reception processing unit (not shown). The duplexer 10 includes a first filter 11, a second filter 12, a common terminal 13, a ground terminal 14, a transmission signal terminal 15, a reception signal terminal 16, a first interconnection 17, second interconnection 18, a third interconnection 19, a fourth interconnection 20, a fifth interconnection 21, a sixth interconnection 22 and a ground interconnection 23.

The first filter 11 includes a first signal input portion 25, a first signal output portion 26, and a first ground portion 27. The second filter 12 includes a second signal input portion 30, a second signal output portion 31, and a second ground portion 32. The first and second filters 11 and 12 according to an embodiment of the present invention are constituted as ladder filters shown in FIG. 2. In a ladder filter, a plurality of filter elements are alternately connected in series with and in parallel to each other. A basic section BS of the ladder filter includes a first filter element F1 that forms a serial arm and a second filter element F2 that forms a parallel arm. The first and second filters 11 and 12 according to the embodiment are realized by SAW filters, in which the first and second filter elements F1 and F2 are constituted by surface acoustic wave (SAW) resonators. The first and second filter elements F1 and F2 may be constituted by a SAW resonator and a capacity, respectively, whereby the first and second filters 11 and 12 may be realized. In addition, an inductance element or a line having an inductance component may be connected to the second filter element F2 in series or in parallel.

In this embodiment, the first filter 11 is used as a transmission filter that has a predetermined passband, more particularly, a passband between 824 MHz and 849 MHz. The second filter 12 is used as a reception filter that has a passband higher than that of the first filter 11, more particularly, a passband between 869 MHz and 894 MHz. In the description given below, the first and second filters 11 and 12 may be referred to as a "transmission filter 11", and a "reception filter 12", respectively.

The first signal output portion 26 and a second signal input portion 30 are connected to a common node CP. The common terminal 13 serving as an antenna terminal is also connected to the common node CP. The first interconnection 17 is connected to the common terminal 13, the first signal output portion 26, and the second signal input portion 30. A matching circuit for reducing interference between the transmission filter 11 and the reception filter 12 and providing a desired filter characteristic is formed at part of the first interconnection 17. The second interconnection 18 is connected to a first ground portion 27. The ground terminal 14 is connected to the first and second interconnections 17 and 18 and a second ground portion 32 and a ground potential is supplied thereto.

The first and second interconnections 17 and 18 are formed so that one of angles between an extending direction of part L1 of the first interconnection 17 and an extending direction of part L2 of the second interconnection 18 on a predetermined virtual plane is set smaller than 90 degrees and that a direction I1 of a current flowing through the part L1 of the first interconnection 17 is opposite to a direction I2 of a current flowing through the part L2 of the second interconnection 18. FIG. 1 shows a case where an angle between the extending direction of the part L1 of the first interconnection 17 and the extending direction of the part L2 of the second interconnection 18 on the predetermined virtual plane is equal to 0 degrees, namely, the extending direction of the part L1 of the first interconnection 17 and the extending direction of the part L2 of the second interconnection 18 are the same. In this embodiment, the part L1 of the first interconnection 17 and the part L2 of the second interconnection 18 are electromagnetically coupled by arranging the first and second interconnections 17 and 18 in the above-described manner.

Here, a state in which the direction I1 of the current flowing through the part L1 of the first interconnection 17 is opposite to the direction I2 of the current flowing through the part L2 of the second interconnection 18 equates to a state in which the direction of magnetic fluxes around the part L1 of the first interconnection 17 is opposite to the direction of magnetic fluxes around the part L2 of the second interconnection 18. When the direction of magnetic fluxes around the part L1 of the first interconnection 17 is opposite to the direction of magnetic fluxes around the part L2 of the second interconnection 18, the magnetic fluxes are canceled. Thus, inductance of the second interconnection 18 apparently decreases.

In addition, electrodes other than those forming the first and second interconnections 17 and 18 are not arranged between the part L1 of the first interconnection 17 and the part L2 of the second interconnection 18. More specifically, the part L1 of the first interconnection 17 and the part L2 of the second interconnection 18 are arranged to form a facing part at which the part L1 of the first interconnection 17 and the part L2 of the second interconnection 18 face each other on a predetermined virtual plane. This allows magnetic fluxes around the part L1 of the first interconnection 17 and the part L2 of the second interconnection 18 to affect one another and the part L1 of the first interconnection 17 and the part L2 of the second interconnection 18 to be electromagnetically coupled preferably.

A width of the part L1 of the first interconnection 17 is set to a value between 50 μm and 150 μm (50 μm≦width<150 μm), for example. A length of the part L1 is set to a value between 0.3 mm and 2 mm (0.3 mm≦length<2 mm). A width of the part L2 of the second interconnection 18 is set to a value between 50 μm and 150 μm (50 μm≦width<150 μm), for example. A length of the part L2 is set to a value between 0.2 mm and 1.5 mm (0.2 mm≦length<1.5 mm). A coupling coefficient of the part L1 of the first interconnection 17 and the part L2 of the second interconnection 18 is set to, for example, 0.4. Preferably, the coupling coefficient is equal to or greater than 0.1 and smaller than 0.6.

The third interconnection 19 interconnects the transmission signal terminal 15 and a first signal input portion 25. The fourth interconnection 20 interconnects the first signal output portion 26 and the common terminal 13. The fifth interconnection 21 interconnects the second signal input portion 30 and the common terminal 13. The fifth interconnection 21 and the fourth interconnection 20 share a part interconnecting the common terminal 13 and the common node CP. The sixth interconnection 22 interconnects the reception signal terminal 16 and a second signal output portion 31. The ground interconnection 23 interconnects a second ground portion 32 and the ground terminal 14. Part of the ground interconnection 23 shares an interconnection between the part L1 of the first interconnection 17 and the ground terminal 14.

A filter device including the transmission filter 11 and the reception filter 12 are flipchip-mounted on a mounting substrate 35, whereby the duplexer 10 according to the embodiment is formed.

Figure 3:
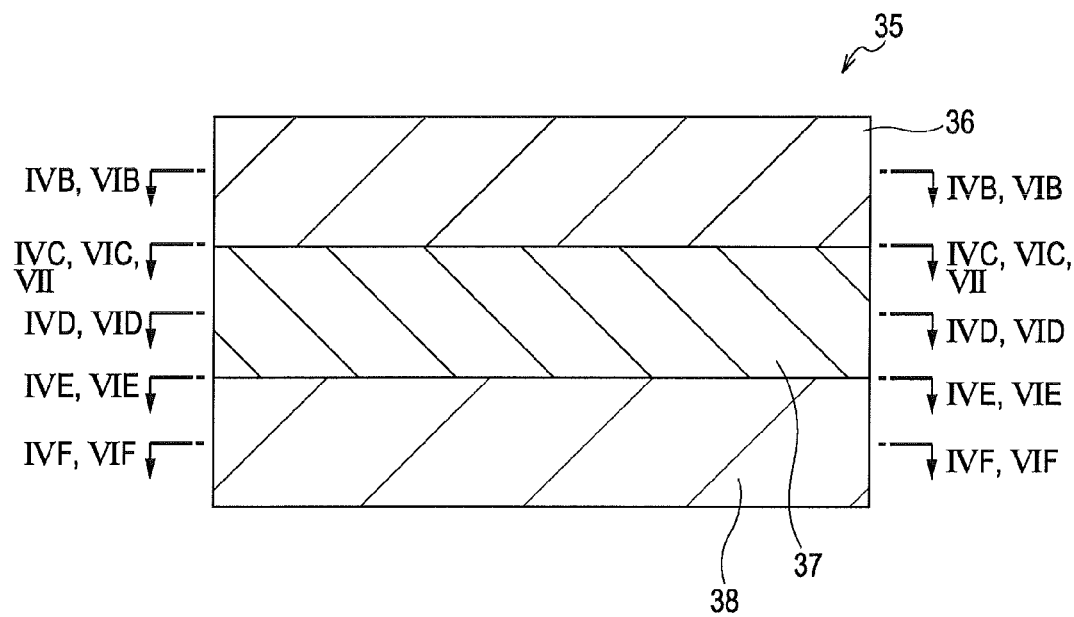
FIG. 3 is a sectional view schematically showing a mounting substrate 35.
Figure 4A:
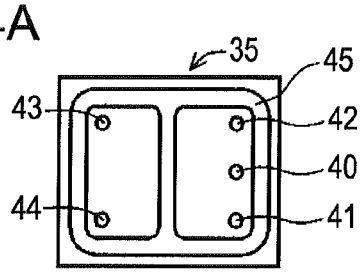
FIGS. 4A to 4G are diagrams showing interconnection structures of a mounting substrate 35.
Figure 4B:
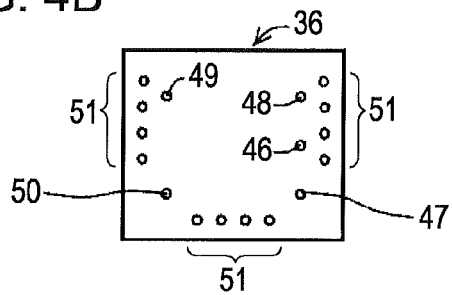
Figure 4C:
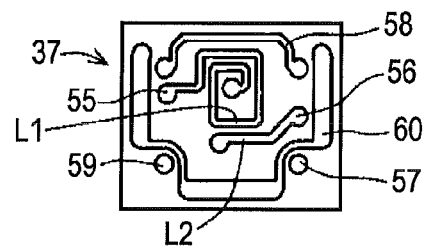
Figure 4D:
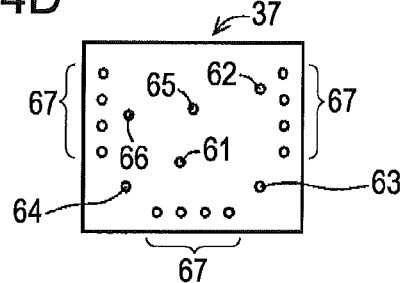
Figure 4E:
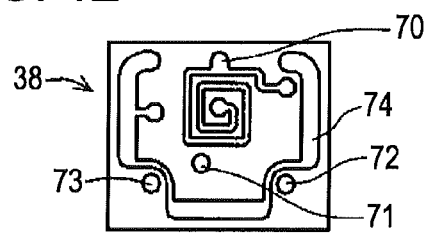
Figure 4F:
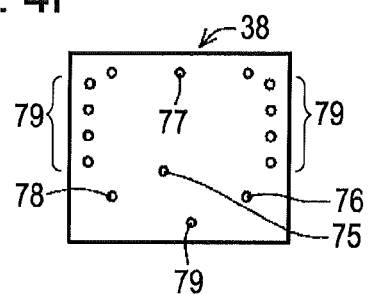
Figure 4G:
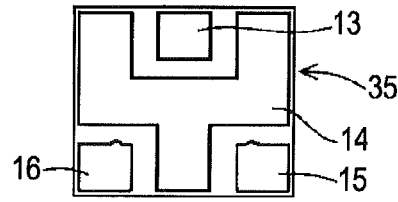

FIG. 3 is a sectional view schematically showing a mounting substrate 35. FIGS. 4A to 4G are diagrams showing interconnection structures of a mounting substrate 35. FIG. 4A is a plan view in a thickness direction of the mounting substrate 35, whereas FIG. 4B is a sectional view showing a first interconnection forming layer 36 taken along the line IVB-IVB shown in FIG. 3. FIG. 4C is a sectional view showing a second interconnection forming layer 37 taken along the line IVC-IVC shown in FIG. 3, whereas FIG. 4D is a sectional view showing the second interconnection forming layer 37 taken along the line IVD-IVD shown in FIG. 3. FIG. 4E is a sectional view showing a third interconnection forming layer 38 taken along the line IVE-IVE shown in FIG. 3, whereas FIG. 4F is a sectional view showing the third interconnection forming layer 38 taken along the line IVF-IVF shown in FIG. 3. FIG. 4G is a bottom plan view showing the mounting substrate 35.

The mounting substrate 35 is a multilayer interconnection substrate having a multilayer structure in which three layers are laminated. The mounting substrate 35 is realized by, for example, a low temperature co-fired ceramics (LTCC) substrate. Since alumina is used as a main material of the LTCC, the LTCC has a relative dielectric constant that is equal to or greater than 6 and smaller than 18. In addition, the mounting substrate 35 may be realized by a resin substrate that employs resin materials, such as a glass epoxy resin, an epoxy resin, and a polyimide resin. The relative dielectric constant of the resin materials is equal to or greater than 3 and smaller than 8. The mounting substrate 35 includes the first interconnection forming layer 36, the second interconnection forming layer 37, and the third interconnection forming layer 38. In the mounting substrate 35, the first to third interconnection forming layers 36 to 38 are laminated in an order of the third interconnection forming layer 38, the second interconnection forming layer 37, and the first interconnection forming layer 36.

The first to third interconnection forming layers 36 to 38 are formed so that a shape of the layers projected onto a virtual plane vertical to the thickness direction thereof is rectangular. In the description given below, two longitudinal ends of each of the first to third interconnection forming layers 36 to 38 are referred to as a first end and a second end. Two breadthwise sides of each of the first to third interconnection forming layers 36 to 38 are referred to as a first side and a second side. Two thickness-direction surfaces of each of the first to third interconnection forming layers 36 to 38 are referred to as a first surface and a second surface. A plurality of interconnection portions, which constitute the first to sixth interconnections 17 to 22 and the ground interconnection 23, are formed on the first surfaces of the first to third interconnection forming layers 36 to 38. In addition, a plurality of vias penetrating through the respective interconnection forming layers are formed on the first to third interconnection forming layers 36 to 38. Furthermore, the common terminal 13, the ground terminal 14, the transmission signal terminal 15, and the reception signal terminal 16 are formed on a bottom face of the mounting substrate 35.

The first interconnection 17 includes a first spiral interconnection portion 55, a second spiral interconnection portion 70, a third ground interconnection portion 74, a tenth via 65 and an eleventh via 66 that penetrate through the second interconnection forming layer 37, and third ground vias 79 penetrating through the third interconnection forming layer 38. Here, the first spiral interconnection portion 55 winds counterclockwise around a position that is at a longitudinal center of the second interconnection forming layer 37 and is closer to the first side from a breadthwise center and extends to a position that is at the second end and is closer to the first side from the breadthwise center. The second spiral interconnection portion 70 winds clockwise around a position that is at the longitudinal center of the third interconnection forming layer 38 and is closer to the first side from the breadthwise center and extends to a position that is at the first end and is closer to the first side from the breadthwise center. The third ground interconnection portion 74 is formed along the first and second ends and the second side of the third interconnection forming layer 38. A matching circuit formed at part of the first interconnection 17 includes the first spiral interconnection portion 55, the second spiral interconnection portion 70, and the tenth via 65 of the first interconnection 17. An end of the first spiral interconnection portion 55 formed at the position that is at the longitudinal center of the second interconnection forming layer 37 and is closer to the first side from the breadthwise center is connected to an end of the second spiral interconnection portion 70 formed at the position that is at the longitudinal center of the third interconnection forming layer 38 and is closer to the first side from the breadthwise center through the tenth via 65. The first interconnection 17 is connected to the third ground interconnection portion 74 through the eleventh via 66 penetrating through the second interconnection forming layer 37.

The second interconnection 18 includes a first interconnection portion 40, a sixth interconnection portion 56, a tenth interconnection portion 71, an eighth interconnection portion 58 formed along the first side, a first via 46 penetrating through the second spiral interconnection portion 70 formed on the third interconnection forming layer 38 and the first interconnection forming layer 36, a sixth via 61 penetrating through the second interconnection forming layer 37, and a twelfth via 75 penetrating through the third interconnection forming layer 38. The first interconnection portion 40 is formed at a position that is closer to the first end from the longitudinal center of the first interconnection forming layer 36 and is at the breadthwise center. The sixth interconnection portion 56 is formed at a position that is around the breadthwise center of the second interconnection forming layer 37 and is closer to the first end from the longitudinal center and extends substantially in the longitudinal direction. The tenth interconnection portion 71 is formed at a position that is closer to the second end from the longitudinal center of the third interconnection forming layer 38 and is closer to the second side from the breadthwise center. The first interconnection portion 40 is connected to a first end of the sixth interconnection portion 56 through the first via 46. A second end of the sixth interconnection portion 56 is connected to the tenth interconnection portion 71 through the sixth via 61. The second interconnection 18 is connected to the ground terminal 14 formed at an area including a portion that is at the longitudinal center and the second side of the bottom face of the mounting substrate 35 and a portion that is at the first and second ends except for the first side.

The third interconnection 19 includes a second interconnection portion 41, a seventh interconnection portion 57, an eleventh interconnection portion 72, a second via 47 penetrating through the first interconnection forming layer 36, an eighth via 63 penetrating through the second interconnection forming layer 37 and a thirteenth via 76 penetrating through the third interconnection forming layer 38. The second interconnection portion 41 is formed at a position that is closer to the first end from the longitudinal center of the first interconnection forming layer 36 and is closer to the second side from a breadthwise center. The seventh interconnection portion 57 is formed at a position that is closer to the first end from the longitudinal center of the second interconnection forming layer 37 and is closer to the second side from the breadthwise center. The eleventh interconnection portion 72 is formed at a position that is closer to the first end from the longitudinal center of the third interconnection forming layer 38 and is closer to the second side from the breadthwise center.

The fourth interconnection 20 includes a third interconnection portion 42, an eighth interconnection portion 58, a second spiral interconnection portion 70 formed at the third interconnecting forming layer 38, a third via 48 penetrating through the first interconnection forming layer 36, a seventh via 62 penetrating through the second interconnection forming layer 37 and a fourteenth via 77 penetrating through the third interconnection forming layer 38. The third interconnection portion 42 is formed at a position that is closer to the first end from the longitudinal center of the first interconnection forming layer 36 and is closer to the first side from a breadthwise center. The eighth interconnection portion 58 is formed at the longitudinal center of the second interconnection forming layer 37 and at the first side.

The fifth interconnection 21 includes a fourth interconnection portion 43, an eighth interconnection portion 58 formed at the second interconnecting forming layer 37, a fourth via 49 penetrating through the first interconnection forming layer 36, a seventh via 62 penetrating through the second interconnection forming layer 37 and a fourteenth via 77 penetrating through the third interconnection forming layer 38. The fourth interconnection portion 43 is formed at a position that is closer to the second end from the longitudinal center of the first interconnection forming layer 36 and is closer to the first side from a breadthwise center.

The sixth interconnection 22 includes a fifth interconnection portion 44, an ninth interconnection portion 59, a twelfth interconnection portion 73, a fifth via 50 penetrating through the first interconnection forming layer 36, a ninth via 64 penetrating through the second interconnection forming layer 37 and a fifteenth via 78 penetrating through the third interconnection forming layer 38. The fifth interconnection portion 44 is formed at a position that is closer to the second end from the longitudinal center of the first interconnection forming layer 36 and is closer to the second side from a breadthwise center. The ninth interconnection portion 59 is formed at a position that is closer to the second end from the longitudinal center of the second interconnection forming layer 37 and is closer to the second side from a breadthwise center. The twelfth interconnection portion 73 is formed at a position that is closer to the second end from the longitudinal center of the third interconnection forming layer 38 and is closer to the second side from a breadthwise center.

The ground interconnection 23 includes a first ground interconnection portion 45, a second ground interconnection portion 60, a third ground interconnection 74 formed at the third interconnection forming layer 38, a first ground via 51 penetrating through the first interconnecting forming layer 36, a second ground via 67 penetrating the second interconnecting forming layer 37 and a third ground via 79 penetrating through the third interconnecting forming layer 38.

The transmission signal terminal 15 is formed at a position that is at a first end of the two longitudinal ends of the bottom face of the mounting substrate 35 and at a second side of two breadthwise sides. Referring back to FIG. 1, a transmission signal input to the transmission signal terminal 15 is supplied to the first signal input portion 25 of the transmission filter 11 after propagating through the third interconnection 19. A signal output from the first signal output portion 26 of the transmission filter 11 propagates through the fourth interconnection 20 and is output from the common terminal 13, which is formed at a position that is at the longitudinal center of the bottom face of the mounting substrate 35 and at the first side of the two breadthwise sides.

In addition, a reception signal input to the common terminal 13 is supplied to the second signal input portion 30 of the reception filter 12 after propagating through the fifth interconnection 21. A signal output from the second signal output portion 31 of the reception filter 12 propagates through the sixth interconnection 22 and is output from the reception signal terminal 16, which is formed at a position that is at the second end of two longitudinal ends of the bottom face of the mounting substrate 35 and at the second side.

In this embodiment, the part L1 of the first interconnection 17 and the part L2 of the second interconnection 18 are formed on an identical layer of the mounting substrate 35. More specifically, part of the first spiral interconnection portion 55 corresponding to the part L1 of the first interconnection 17 and part of the sixth interconnection portion 56 corresponding to the part L2 of the second interconnection 18 are formed on the first surface of the second interconnection forming layer 37. The description will be given below using the "part L1 of the first spiral interconnection portion 55" and the "part L2 of the sixth interconnection portion 56".

More specifically, the first spiral interconnection portion 55 and the sixth interconnection portion 56 are formed on the first surface of the second interconnection forming layer 37 so that an angle between the extending direction of the part L1 of the first spiral interconnection portion 55 and the extending direction of the part L2 of the sixth interconnection portion 56 on the first surface of the second interconnection forming layer 37 is smaller than 90 degrees, e.g., 0 degrees in this embodiment, and that a direction of a current flowing through the part L1 of the first spiral interconnection portion 55 is opposite to a direction of a current flowing through the part L2 of the sixth interconnection portion 56. That is, the first spiral interconnection portion 55 and the sixth interconnection portion 56 are formed on the first surface of the second interconnection forming layer 37 so that the extending direction of the part L1 of the first spiral interconnection portion 55 and the extending direction of the part L2 of the sixth interconnection portion 56 are the same and the direction of the current flowing through the part L1 of the first spiral interconnection portion 55 and the direction of the current flowing through the part L2 of the sixth interconnection portion 56 are opposite. In this manner, the part L1 of the first spiral interconnection portion 55 and the part L2 of the sixth interconnection portion 56 are electromagnetically coupled.

Here, a state in which the direction of the current flowing through the part L1 of the first spiral interconnection portion 55 is opposite to the direction of the current flowing through the part L2 of the sixth interconnection portion 56 equates to a state in which the direction of magnetic fluxes around the part L1 of the first spiral interconnection portion 55 is opposite to the direction of magnetic fluxes around the part L2 of the sixth interconnection portion 56.

In this embodiment, the part L1 of the first spiral interconnection portion 55 and the part L2 of the sixth interconnection portion 56 are designed so that the coupling coefficient is equal to 0.3. In this manner, the part L1 of the first spiral interconnection portion 55 and the part L2 of the sixth interconnection portion 56 are electromagnetically coupled.

In this embodiment, no other interconnections are formed between the part L1 of the first spiral interconnection portion 55 and the part L2 of the sixth interconnection portion 56 on the first surface of the second interconnection forming layer 37 so that the part L1 of the first spiral interconnection portion 55 and the part L2 of the sixth interconnection portion 56 can be electromagnetically coupled.

As described above, the first spiral interconnection portion 55 and the sixth interconnection portion 56 are formed so that an angle between the extending direction of the part L1 of the first spiral interconnection portion 55 and the extending direction of the part L2 of the sixth interconnection portion 56 on a predetermined virtual plane is equal to 0 degrees in the duplexer 10 according to this embodiment. That is, the first spiral interconnection portion 55 and the sixth interconnection portion 56 are formed so that the extending direction of the part L1 of the first spiral interconnection portion 55 and the extending direction of the part L2 of the sixth interconnection potion 56 are the same. Furthermore, the first spiral interconnection portion 55 and the sixth interconnection portion 56 are formed so that the direction of the current flowing through the part L1 of the first spiral interconnection portion 55 is opposite to the direction of the current flowing through the part L2 of the sixth interconnection portion 56.

An approach of the part L1 of the first spiral interconnection portion 55 to the part L2 of the sixth interconnection portion 56 increases the mutual inductive coupling, which cancels magnetic fluxes since the direction of the current flowing through the part L1 of the first spiral interconnection portion 55 is opposite to the direction of the current flowing through the part L2 of the sixth interconnection portion 56, i.e., since the direction of the magnetic fluxes around the part L1 of the first spiral interconnection portion 55 is opposite to the direction of the magnetic fluxes around the part L2 of the sixth interconnection portion 56. Accordingly, the inductance of the sixth interconnection portion 56 apparently decreases.

A capacitor of the transmission filter 11, the mutual inductance formed by the part L1 of the first spiral interconnection portion 55 and the part L2 of the sixth interconnection portion 56, and the inductance of the sixth interconnection portion 56 constitute a series resonant circuit. An increase in the mutual inductance formed by the part L1 of the first spiral interconnection portion 55 and the part L2 of the sixth interconnection portion 56 increases the mutual inductive coupling, which increases a resonance frequency of the series resonant circuit since the direction of the current flowing through the part L1 of the first spiral interconnection portion 55 is opposite to the direction of the current flowing through the part L2 of the sixth interconnection portion 56.

As described above, the first spiral interconnection portion 55 and the sixth interconnection portion 56 are formed so that the extending direction of the part L1 of the first spiral interconnection portion 55 and the extending direction of the part L2 of the sixth interconnection portion 56 are the same and that the direction of the current flowing through the part L1 of the first spiral interconnection portion 55 is opposite to the direction of the current flowing through the part L2 of the sixth interconnection portion 56. By forming the interconnection portions 55 and 56 in this manner, it is possible to resonate the series resonant circuit at a higher frequency band that is outside of a passband (hereinafter, referred to as a higher non-passband frequency band) of the transmission filter 11, which has the passband lower than that of the reception filter 12, whereby an attenuation pole can be relatively easily provided. Since this can increase attenuation at the higher non-passband frequency band of the transmission filter 11, namely, at a higher attenuation band, an attenuation characteristic can be improved.

Furthermore, since the attenuation can be increased at the higher non-passband frequency band of the transmission filter 11, leakage of signals from the transmission filter 11 to the reception filter 12 can be decreased as much as possible. Accordingly, it is possible to improve an isolation characteristic at the higher non-passband frequency band of the transmission filter 11.

Additionally, in the duplexer 10 according to this embodiment, the part L1 of the first spiral interconnection portion 55 and the part L2 of the sixth interconnection portion 56 are formed on an identical layer of the mounting substrate 35, more particularly, on the second interconnection forming layer 37. Accordingly, the number of layers of the mounting substrate 35 can be decreased in comparison with a case where the part L1 of the first spiral interconnection portion 55 and the part L2 of the sixth interconnection portion 56 are formed on different layers of the mounting substrate 35. Thus, the mounting substrate 35 can be miniaturized in the thickness direction.

Figure 5:
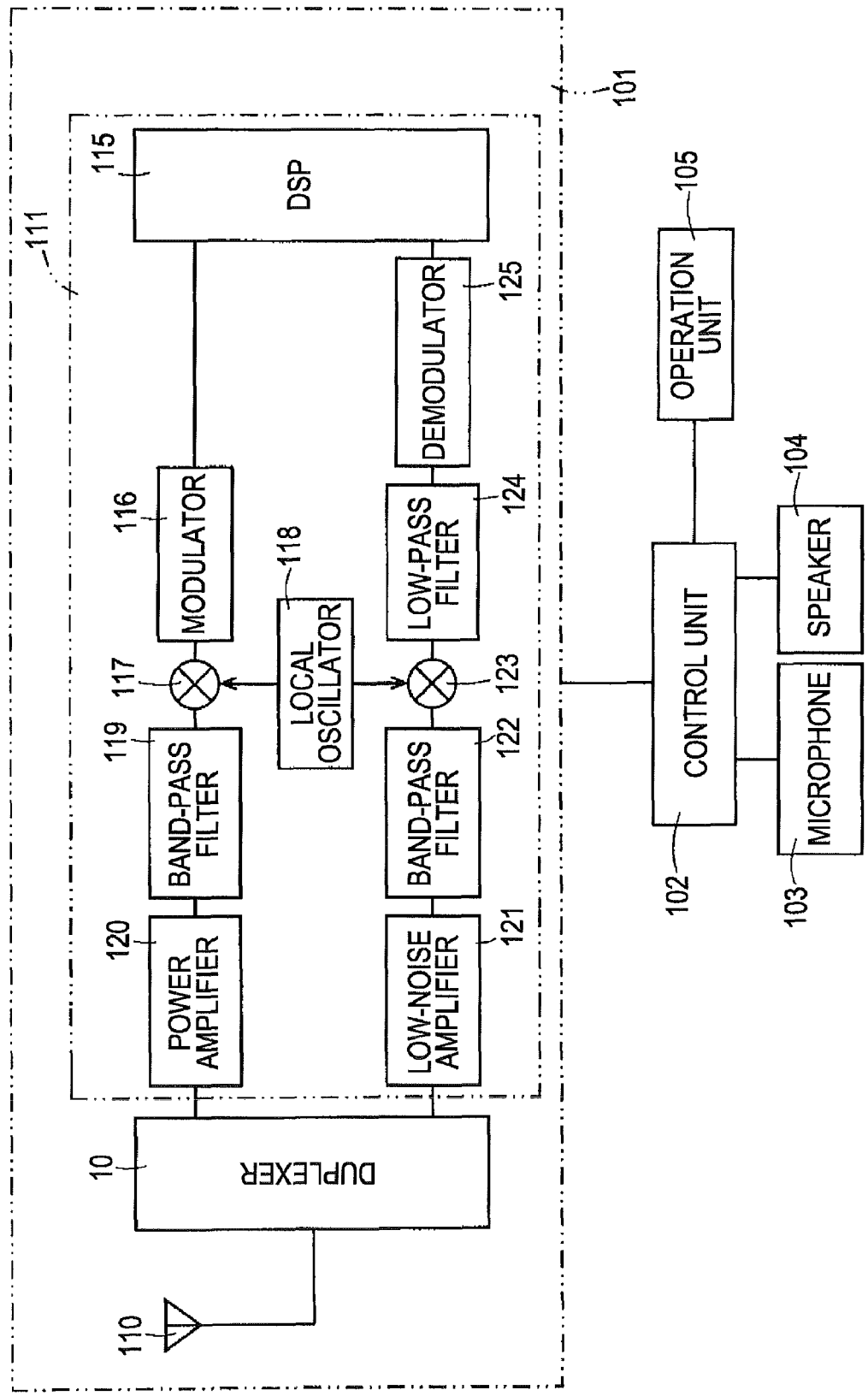
FIG. 5 is a block diagram showing a configuration of a communication device 110 according to an embodiment of the present invention.

FIG. 5 is a block diagram showing a configuration of a communication device 100 according to an embodiment of the present invention. A communication device 100 may be realized by, for example, a mobile phone. The communication device 100 includes a transmission/reception unit 101, a control unit 102, a microphone 103, a speaker 104 and an operation unit 105. The transmission/reception unit 101 includes an antenna 110, a duplexer 10 and a transmission/reception processing unit 111. The transmission/reception processing unit 111 is connected to a digital signal processor (DSP) 115, a modulator 116, a first mixer 117, a local oscillator 118, a first band-pass filter (hereinafter, referred as a "first BPF") 119, a power amplifier 120, a low-noise amplifier 121, a second band-pass filter (hereinafter, referred to as a "second BPF") 122, a second mixer 123, a low-pass filter (hereinafter, referred to as an "LPF") 124 and demodulator 125. The microphone 103, the speaker 104 and the operation unit 105 are connected to the control unit 102.

The operation unit 105 has a plurality of operation buttons, such as operation keys operated by an operator. In response to an operation of each operation button, the operation unit 105 generates a signal representing predetermined information corresponding to the operation, such as numeral information, character information, and instruction information directed to a communication device main body, and supplies the generated signal to the control unit 102. Accordingly, the operator operates each operation button of the operation unit 105, thereby being able to input information to the communication device main body. The control unit 102 includes a central processing unit (CPU), for example. The control unit 102 controls a transmission/reception unit 101, the microphone 103, the speaker 104, and the operation unit 105 on the basis of control programs stored therein.

The control unit 102 converts sound, which is input to the microphone 103 after the operator operates the operation unit 105, into a digital signal from an analog signal though analog/digital (A/D) conversion. The control unit 102 supplies the digital signal to DSP 115. The DSP 115 performs a wave-shaping operation after compressing audio signals supplied from the control unit 102 and synchronizing the audio signals according to a time division multiple Access (TDMA) method to generate a baseband signal. The modulator 116 converts the baseband signal into an analog signal through digital/analog (D/A) conversion and generates a modulated wave according to a predetermined modulation method of the mobile phone. The first mixer 117 multiplies an oscillation signal having a predetermined oscillation frequency generated by a local oscillator 118 and the modulated wave supplied from the modulator 116 to perform frequency conversion. The first BPF 119 attenuates unnecessary signals included in the signal having undergone the frequency conversion performed by the first mixer 117. The power amplifier 120 then amplifies the signal to desired signal intensity. The amplified signal is transmitted to another communication device from the antenna 110 through the duplexer 10.

In addition, a signal received by the antenna 110 is supplied to the low-noise amplifier 121 through the duplexer 10. After the low-noise amplifier 121 amplifies the signal, the second BPF 122 attenuates unnecessary signals included in the amplified signal and supplies the signal to the second mixer 123. The second mixer 123 multiplies an oscillation signal having a predetermined oscillation frequency generated by the local oscillator 118 and the signal supplied from the second BPF 122 to perform frequency conversion. The low-pass filter (hereinafter, referred to as an "LPF") 124 removes signals of unnecessary frequencies from the frequency-converted signal, passes signals of a frequency band equal to or lower than a predetermined cutoff frequency, and supplies the signal to the demodulator 125. The demodulator 125 demodulates the signal supplied from the LPF 124 into an audio signal, converts the demodulated audio signal into a digital signal through A/D conversion, and supplies the digital signal to the DSP 115. The DSP 115 decompresses the compressed digital signal supplied from the demodulator 125. The DSP 115 then converts the digital signal into an analog signal through D/A conversion. The speaker 104 then outputs the sound.

In a communication device according to the present embodiment as described above, the transmission/reception processing unit 111 supplies a signal to a first signal input portion 25 of the duplexer 10, thereby transmitting the signal to another communication device through the antenna 110 connected to the common terminal 13. The transmission/reception processing unit 111 also receives a signal supplied from a second signal output portion 31 of the duplexer 10, thereby receiving signals transmitted from another communication device. Since the communication device 100 includes a duplexer 10 capable improving an attenuation characteristic and an isolation characteristic at a higher non-passband frequency band of the transmission filter 11, the communication device 100 is capable of transmitting/receiving high-quality signals without transmitting/receiving unnecessary signals of the non-passband frequency band.

Figure 6A:
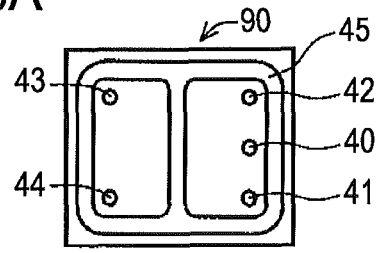
FIGS. 6A to 6G are diagrams showing interconnection structures of a mounting substrate 90.
Figure 6E:
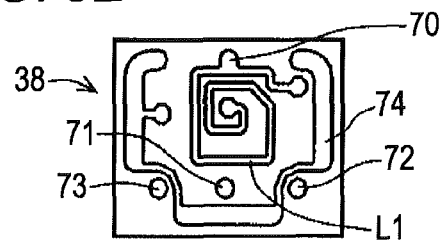
Figure 6B:
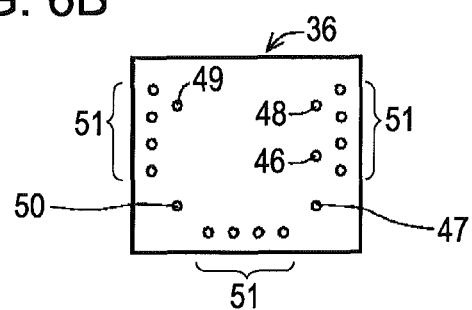
Figure 6F:
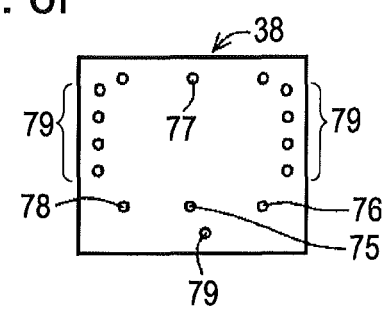
Figure 6C:
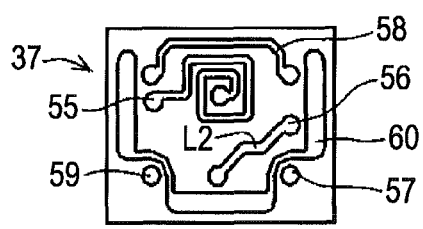
Figure 6G:
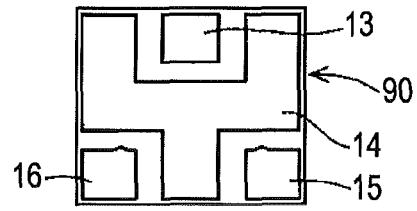
Figure 6D:
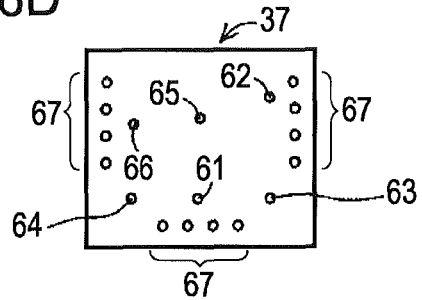
Figure 7:
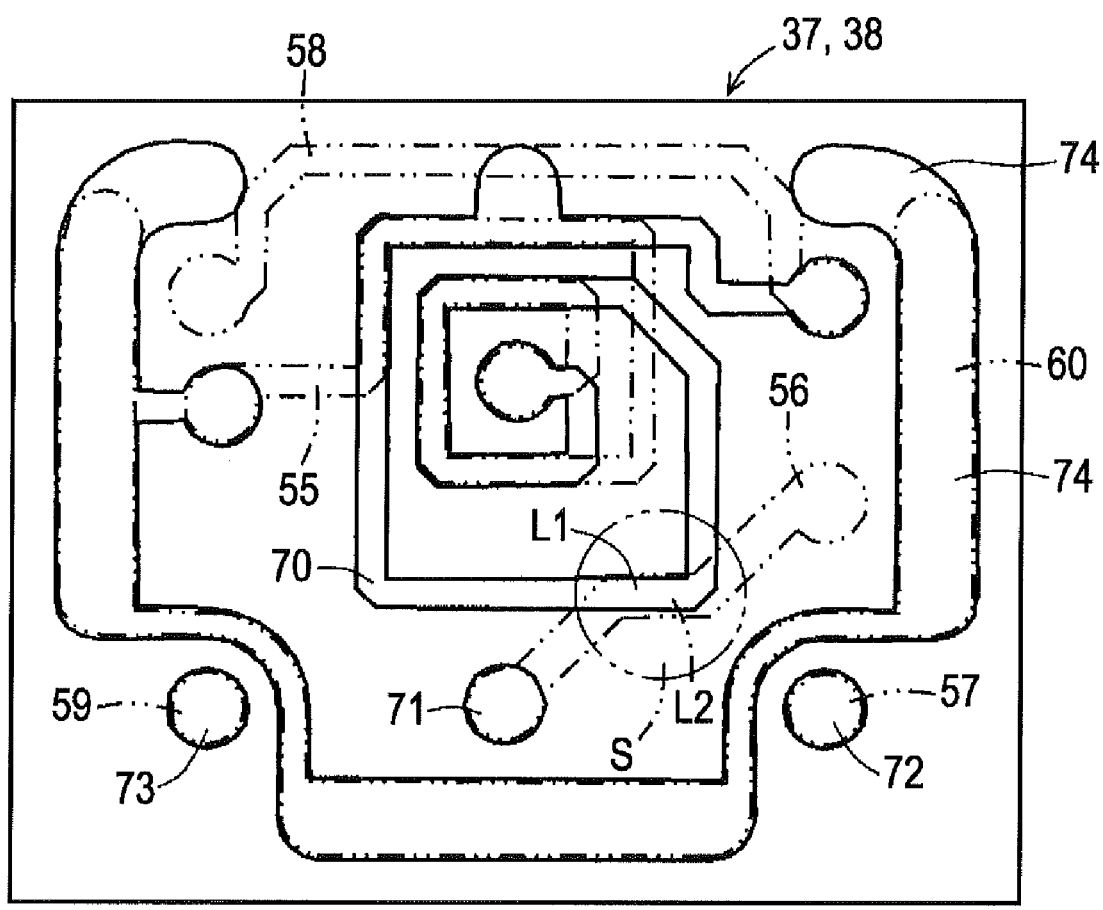
FIG. 7 is a sectional view showing interconnection structures of second and third interconnection forming layers 37 and 38 taken from the line VII-VII shown in FIG. 3.

A duplexer according to a second embodiment of the present invention will now be described. FIGS. 6A to 6G are diagrams showing interconnection structures of a mounting substrate 90. FIG. 6A is a plan view in a thickness direction of a mounting substrate 90, whereas FIG. 6B is a sectional view showing a first interconnection forming layer 36 taken along the line VIB-VIB shown in FIG. 3. FIG. 6C is a sectional view showing a second interconnection forming layer 37 taken along the line VIC-VIC shown in FIG. 3, whereas FIG. 6D is a sectional view showing the second interconnection forming layer 37 taken along the line VID-VID shown in FIG. 3. FIG. 6E is a sectional view showing a third interconnection forming layer 38 taken along the line VIE-VIE shown in FIG. 3, whereas FIG. 6F is a sectional view showing the third interconnection forming layer 38 taken along the line VIF-VIF shown in FIG. 3. FIG. 6G is a bottom plan view showing the mounting substrate 90. FIG. 7 is a sectional view showing interconnection structures of second and third interconnection forming layers 37 and 38 taken from the line VII-VII shown in FIG. 3. Referring to FIG. 7, a solid line represents the third interconnection forming layer 38, whereas a two-dot chain line represents the second interconnection forming layer 37.

Since the duplexer according to this embodiment is similar to the above-described duplexer 10 according to the first embodiment, only differences will be described. Similar or like reference numerals are attached to elements corresponding to those of the first embodiment and a description regarding common elements is omitted to avoid the overlap.

Like the mounting substrate 35, the mounting substrate 90 is a multiplayer interconnection substrate having a multiplayer structure in which the first to third interconnection forming layers 36 to 38 are laminated in an order of the third interconnection forming layer 38, the second interconnection forming layer 37, and the first interconnection forming layer 36. The mounting substrate 90 may be realized by, for example, an LTCC substrate.

As in the case of the first embodiment, a second interconnection 18 according to this embodiment includes a first interconnection portion 40, a sixth interconnection portion 56, a tenth interconnection portion 71, a first via 46, a sixth via 61, and a twelfth via 75. However, the positions of those components differ. The first interconnection portion 40 according to this embodiment is formed at a position that is at a breadthwise center and is closer to a first end from a longitudinal center of the first interconnection forming layer 36. The sixth interconnection portion 56 is formed at a position that is closer to the first end from the longitudinal center of the second interconnection forming layer 37 and is closer to a second side from the breadthwise center. The tenth interconnection portion 71 is formed at a position that is at the longitudinal center of the third interconnection forming layer 38 and is closer to the second side from the breadthwise center. The sixth via 61 according to this embodiment is formed at a position closer to the second side than that of the sixth via 61 according to the first embodiment. The twelfth via 75 according to this embodiment is formed at a position closer to the second side and a first end than that of the twelfth via 75 according to the first embodiment.

In this embodiment, part L1 of the first interconnection 17 and part L2 of the second interconnection 18 are formed on different layers of the mounting substrate 90. More specifically, part of a second spiral interconnection portion 70 corresponding to the part L1 of the first interconnection 17 is formed on the third interconnection forming layer 38, whereas part of the sixth interconnection portion 56 corresponding to the part L2 of the second interconnection 18 is formed on the second interconnection forming layer 37. The description will be given below using "the part L1 of the second spiral interconnection portion 70" and "the part L2 of the sixth interconnection portion 56".

More specifically, when the second interconnection forming layer 37 is laminated on the third interconnection forming layer 38, the second spiral interconnection portion 70 and the sixth interconnection portion 56 are formed on the third and second interconnection forming layers 38 and 37, respectively, so that the part L1 of the second spiral interconnection portion 70 and the part L2 of the sixth interconnection portion 56 overlap when it is viewed from the thickness direction of the second and third interconnection forming layers 37 and 38 as shown in a section S of FIG. 7.

More specifically, the second spiral interconnection portion 70 and the sixth interconnection portion 56 are formed on the third and second interconnection forming layers 38 and 37, respectively, so that an angle between the extending direction of the part L1 of the second spiral interconnection portion 70 and the extending direction of the part L2 of the sixth interconnection portion 56 on a virtual plane vertical to the thickness direction of the second and third interconnection forming layers 37 and 38 is smaller than 90 degrees, e.g., 0 degrees in this embodiment, and that a direction of the current flowing through the part L1 of the second spiral interconnection portion 70 is opposite to the direction of the current flowing through the part L2 of the sixth interconnection portion 56. That is, the second spiral interconnection portion 70 and the sixth interconnection portion 56 are formed on the third and second interconnection forming layers 38 and 37, respectively, so that the extending direction of the part L1 of the second spiral interconnection portion 70 and the extending direction of the part L2 of the sixth interconnection portion 56 are the same and the direction of the current flowing through the part L1 of the second spiral interconnection portion 70 and the direction of the current flowing through the part L2 of the sixth interconnection portion 56 are opposite. In this manner, the part L1 of the second spiral interconnection portion 70 and the part L2 of the sixth interconnection portion 56, which are shown in the section S of FIG. 7, are electromagnetically coupled.

Here, a state in which the direction of the current flowing through the part L1 of the second spiral interconnection portion 70 is opposite to the direction of the current flowing through the part L2 of the sixth interconnection portion 56 equates to a state in which the direction of magnetic fluxes around the part L1 of the second spiral interconnection portion 70 is opposite to the direction of magnetic fluxes around the part L2 of the sixth interconnection portion 56.

In this embodiment, the part L1 of the second spiral interconnection portion 70 and the part L2 of the sixth interconnection portion 56 are designed so that a coupling coefficient is equal to 0.4. In this manner, the part L1 of the second spiral interconnection portion 70 and the part L2 of the sixth interconnection portion 56 are electromagnetically coupled.

In this embodiment, no other interconnections are formed between the part L1 of the second spiral interconnection portion 70 and the part L2 of the sixth interconnection portion 56 in the thickness direction of the second and third interconnection forming layers 37 and 38 so that the part L1 of the second spiral interconnection portion 70 and the part L2 of the sixth interconnection portion 56 can be electromagnetically coupled.

As described above, the second spiral interconnection portion 70 and the sixth interconnection portion 56 are formed so that an angle between the extending direction of the part L1 of the second spiral interconnection portion 70 and the extending direction of the part L2 of the sixth interconnection portion 56 is equal to 0 degrees on a predetermined virtual plane in the duplexer according to this embodiment. That is, the second spiral interconnection portion 70 and the sixth interconnection portion 56 are formed so that the extending direction of the part L1 of the second spiral interconnection portion 70 and the extending direction of the part L2 of the sixth interconnection potion 56 are the same. Furthermore, the part L1 of the second spiral interconnection portion 70 and the part L2 of the sixth interconnection portion 56 are formed so that the direction of the current flowing through the part L1 of the second spiral interconnection portion 70 is opposite to the direction of the current flowing through the part L2 of the sixth interconnection portion 56.

An approach of the part L1 of the second spiral interconnection portion 70 to the part L2 of the sixth interconnection portion 56 increases the mutual inductive coupling, which cancels magnetic fluxes since the direction of the current flowing through the part L1 of the second spiral interconnection portion 70 is opposite to the direction of the current flowing through the part L2 of the sixth interconnection portion 56, namely, since the direction of the magnetic fluxes around the part L1 of the second spiral interconnection portion 70 is opposite to the direction of the magnetic fluxes around the part L2 of the sixth interconnection portion 56. Accordingly, the inductance of the sixth interconnection portion 56 apparently decreases.

A capacitor of the transmission filter 11, the mutual inductance formed by the part L1 of the second spiral interconnection portion 70 and the part L2 of the sixth interconnection portion 56, and the inductance of the sixth interconnection portion 56 constitute a series resonant circuit. An increase in the mutual inductance formed by the part L1 of the second spiral interconnection portion 70 and the part L2 of the sixth interconnection portion 56 increases the mutual inductive coupling, which increases a resonance frequency of the series resonant circuit since the direction of the current flowing through the part L1 of the second spiral interconnection portion 70 is opposite to the direction of the current flowing through the part L2 of the sixth interconnection portion 56.

As described above, the second spiral interconnection portion 70 and the sixth interconnection portion 56 are formed so that the extending direction of the part L1 of the second spiral interconnection portion 70 and the extending direction of the part L2 of the sixth interconnection portion 56 are the same and that the direction of the current flowing through the part L1 of the second spiral interconnection portion 70 is opposite to the direction of the current flowing through the part L2 of the sixth interconnection portion 56. By forming the interconnection portions 70 and 56 in this manner, it is possible to resonate the series resonant circuit at a higher frequency band that is outside of a passband (hereinafter, referred to as a higher non-passband frequency band) of the transmission filter 11, which has the passband lower than that of the reception filter 12, whereby an attenuation pole can be relatively easily provided. Since this can increase attenuation at the higher non-passband frequency band of the transmission filter 11, an attenuation characteristic can be improved.

Furthermore, since the attenuation can be increased at the higher non-passband frequency band of the transmission filter 11, leakage of signals from the transmission filter 11 to the reception filter 12 can be decreased as much as possible. Accordingly, it is possible to improve an isolation characteristic at the higher non-passband frequency band of the transmission filter 11.

As shown in FIG. 7, the second spiral interconnection portion 70 and the sixth interconnection portion 56 are formed on the third and second interconnection forming layers 38 and 37, respectively, so that the part L1 of the second spiral interconnection portion 70 and the part L2 of the sixth interconnection portion 56 overlap when it is viewed from the thickness direction (hereinafter, referred to as a "layer thickness direction") of the second and third interconnection forming layers 37 and 38 in this embodiment. That is, the part L1 of the second spiral interconnection portion 70 and the part L2 of the sixth interconnection portion 56 are formed at a predetermined interval provided in the layer thickness direction. In this manner, a size of a facing area, namely, a size of an overlapping area of the part L1 of the second spiral interconnection portion 70 and the part L2 of the sixth interconnection portion 56 in the layer thickness direction can be increased in comparison with a case of forming the part L1 of the second spiral interconnection portion 70 and the part L2 of the sixth interconnection portion 56 on an identical layer.

To increase the degree of coupling between the part L1 of the second spiral interconnection portion 70 and the part L2 of the sixth interconnection portion 56, the size of the facing area has to be increased and an interval between the part L1 of the second spiral interconnection portion 70 and the part L2 of the sixth interconnection portion 56 in the h layer thickness direction has to be decreased. In addition, to obtain a constant degree of coupling between the part L1 of the second spiral interconnection portion 70 and the part L2 of the sixth interconnection portion 56, the interval between the part L1 of the second spiral interconnection portion 70 and the part L2 of the sixth interconnection portion 56 in the layer thickness direction has to be increased as the size of the facing area increases.

Since the size of the facing area can be increased in this embodiment, it is possible to further increase the degree of coupling between the part L1 of the second spiral interconnection portion 70 and the part L2 of the sixth interconnection portion 56 than the above-described first embodiment and to easily adjust the inductance resulting from the mutual inductive coupling.

The part L1 of the second spiral interconnection portion 70 and the part L2 of the sixth interconnection portion 56 are formed on different layers of the mounting substrate 90, more particularly, on the third and second interconnection forming layer 38 and 37, respectively, in the duplexer according to this embodiment. Accordingly, sizes of the first surfaces of the third and second interconnection forming layers 38 and 37 having the part L1 of the second spiral interconnection portion 70 and the part L2 of the sixth interconnection portion 56, respectively, can be decreased in comparison with a case where the part L1 of the second spiral interconnection portion 70 and the part L2 of the sixth interconnection portion 56 are formed on an identical layer of the mounting substrate 90. In this manner, the mounting substrate 90 can be miniaturized in a direction vertical to the thickness direction.

The communication device 100 including the duplexer 100 has been described in the first embodiment. The communication device 100 may include the duplexer according to this embodiment instead of the duplexer 10. In this case, like the above-described first embodiment, the communication device 100 capable of transmitting/receiving high-quality signals without transmitting/receiving unnecessary signals of a non-passband frequency band can be realized.

Example

An example of the duplexer 10 and a comparative example will now be described below. Three-layered LTCC is used as a material of the mounting substrate 35 constituting the duplexer 10. The LTCC is mainly made of alumina and has a relative dielectric constant of 9.4. A thickness of one layer of the LTCC is equal to 0.125 mm. Electrodes made of silver are formed on surfaces of each layer. The smallest width of the electrodes is equal to 0.075 mm. In addition, a diameter of a via that connects the electrodes formed on the surfaces of the layers is equal to 0.1 mm. The via is filled with silver.

To constitute a duplexer of 800 MHz, a filter having a passband between 824 MHz and 849 MHz and a filter having a passband between 869 MHz and 894 MHz are used as a transmission filter and a reception filter, respectively.

Figure 8:
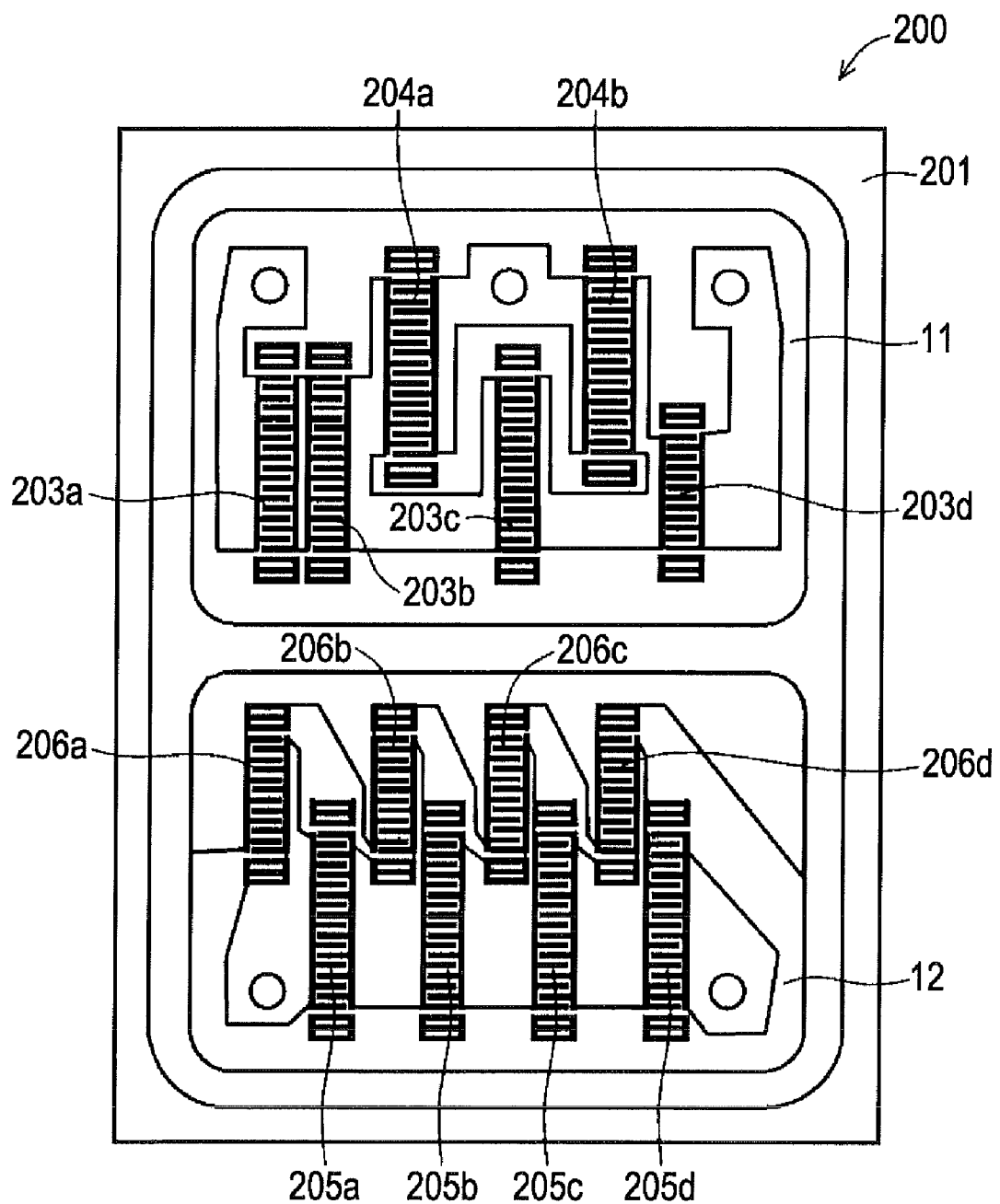
FIG. 8 is a diagram schematically showing a SAW device 200.

In this example, a SAW device was formed using a thin film process. Referring to FIG. 8, single crystal of lithium tantalate ($LiTaO_3$) was used as a piezoelectric substrate 201. A titanium (Ti) thin film having a thickness of 6 nm was formed on a main surface of the piezoelectric substrate 201 (hereinafter, also simply referred to as a "main surface"), which is a thickness-direction surface. An aluminum-copper (Al—Cu) thin film having a thickness of 130 nm was then formed on a thickness-direction surface of the Ti thin film. Three layers of such thin films were laminated alternately, whereby a six-layer Ti/Al—Cu laminated film was formed.

Photoresist was then applied using a resist applying apparatus so that the thickness of the photoresist was approximately equal to 0.5 µm. A stepper then formed a photoresist pattern. Subsequently, the photoresist of an unnecessary part was dissolved by alkali developing solvent in a developing apparatus. A reactive ion etching (RIE) system formed electrode patterns. A protection film was then formed at a predetermined area of the electrode patterns. More specifically, a chemical vapor deposition (CVD) apparatus formed a silica ($SiO_2$) film having a thickness of 0.02 µm on the electrode patterns and the main surface of the piezoelectric substrate 201.

Patterning of the photoresist was performed using photolithography and etching of the protection film of the flipchip electrodes was performed by the RIE system or the like. Layered electrodes of chromium (Cr), nickel (Ni), and gold (Au) were then formed using a sputtering apparatus. The thickness of the formed layered electrodes was approximately equal to 1 μm. The photoresist and the layered electrodes formed at unnecessary areas were removed at the same time using a liftoff method and a pad to be connected to flipchip bumps was formed. Dicing processing was then performed on the piezoelectric substrate 201 along a dicing line and the piezoelectric substrate 201 is divided into SAW device chips.

FIG. 8 is a diagram schematically showing a SAW device 200. The SAW device 200 includes a transmission filter 11 and a reception filter 12. The transmission filter 11 is a ladder filter including series resonators 203a, 203b, 203c, and 203d forming a serial arm and parallel resonators 204a and 204b forming parallel arms. In addition, the reception filter 12 is also a ladder filter including series resonators 205a, 205b, 205c, and 205d forming a serial arm and parallel resonators 206a, 206b, 206c, and 206d forming parallel arms.

Then, electrode patterns formed of solder were printed on a thickness-direction surface of the LTCC mounting substrate 35. Using a flipchip mounting apparatus, each of the above-described chips and the LTCC mounting substrate 35 were temporarily bonded so that an electrode-having surface of each chip of the SAW device 200 faces a surface of the LTCC substrate having the electrode pattern printed thereon. By baking the substrate 35 in a nitrogen (N$_2$) gas atmosphere to melt the solder, each of the chips and the LTCC substrate were bonded. A resin was applied to the chip-bonded LTCC substrate and the LTCC substrate was then baked in the N$_2$ atmosphere to seal each chip with the resin. Dicing processing was then performed on the mounting substrate 35 along a dicing line to divide the substrate 35 into a plurality of pieces. In this manner, the duplexer 10 according to an embodiment of the present invention was manufactured.

The first signal output portion 26 of the transmission filter 11, the part L1 of the first interconnection 17 to be connected to the second signal input portion 30 of the reception filter 12 and the ground terminal 14, and the part L2 of the second interconnection 18 to be connected to the first ground portion 27 of the transmission filter 11 and the ground terminal 14 are arranged at an interval of 0.075 mm so that the extending direction of the part L1 of the first interconnection 17 and the extending direction of the part L2 of the second interconnection 18 are the same. A matching circuit formed at part of the first interconnection 17 includes the first spiral interconnection portion 55, the second spiral interconnection portion 70, and the tenth via 65 of the first interconnection 17. The matching circuit is 10.37 mm long and has inductance of 7.9 nH. In addition, the part L1 of the first interconnection 17 is 0.5 mm long and has inductance of 0.25 nH.

The second interconnection 18 includes the first interconnection portion 40, the sixth interconnection portion 56, the tenth interconnection portion 71, the first via 46, the sixth via 61, and the twelfth via 75. The second interconnection 18 is 1.0 mm long and has inductance of 0.69 nH. In addition, the part L2 of the second interconnection 18 is 0.55 mm long and has inductance of 0.33 nH.

Furthermore, the part L1 of the first interconnection 17 and the part L2 of the second interconnection 18 are arranged so that the direction of the current flowing through the part L1 of the first interconnection 17 is opposite to the direction of the current flowing through the part L2 of the second interconnection 18. An interval between the part L1 of the first interconnection 17 and the part L2 of the second interconnection 18 is equal to 0.075 mm, mutual inductance thereof is equal to 0.12 nH, and a coupling coefficient thereof is equal to 0.4. Here, a value of each of the inductance and the coupling coefficient is determined using simulation software "Q3D Extractor" provided by Ansoft Corporation.

An attenuation characteristic and an isolation characteristic were measured using the duplexer 10 manufactured by flipchip-mounting the SAW device 200 on the mounting substrate 35 having a structure shown in FIGS. 4A to 4G. The isolation characteristic is a characteristic of leakage of a signal from one filer to another filter. In this example, an RF signal was applied to the first signal input portion 25 of the transmission filter 11 and the signal output from the second signal output portion 31 of the reception filter 12 was measured, whereby the isolation characteristic between the first signal input portion 25 and the second signal output portion 31 was evaluated.

Figure 9:
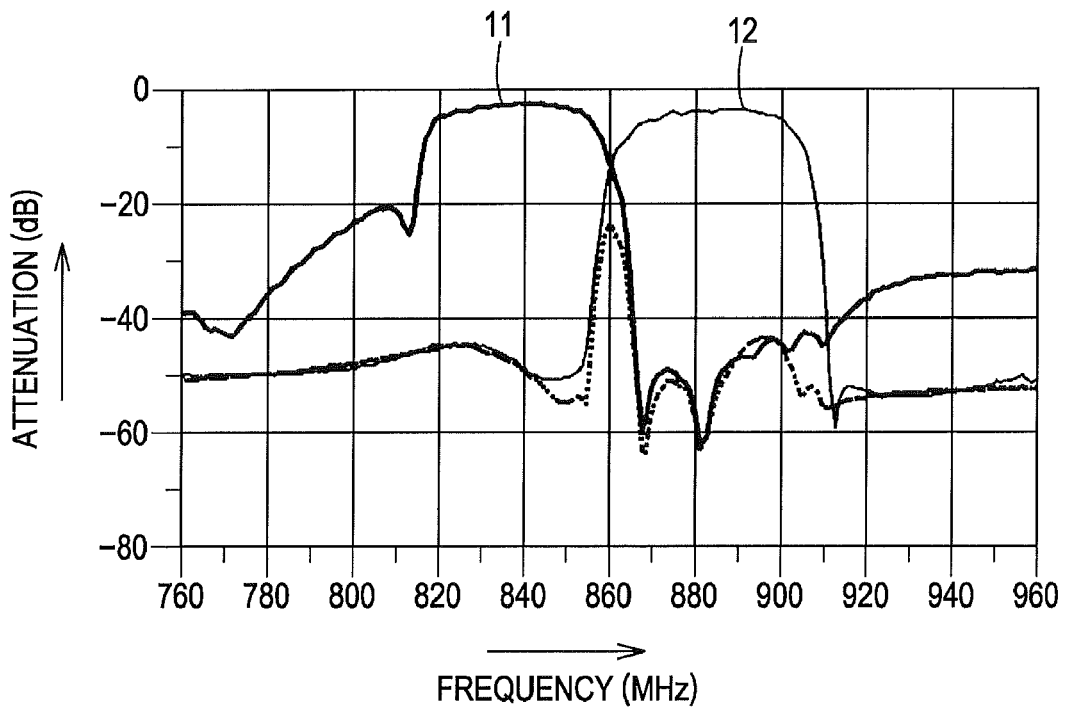
FIG. 9 is a graph showing a measurement result of an attenuation characteristic and an isolation characteristic according to an example of an embodiment.

FIG. 9 shows a measurement result of an attenuation characteristic and an isolation characteristic of this example. The horizontal axis of a graph shown in FIG. 9 represents a frequency (MHz), whereas the vertical axis represents attenuation and isolation (dB). Referring to FIG. 9, a thick solid line represents the attenuation characteristic of the transmission filter 11, whereas a thin solid line represents the attenuation characteristic of the reception filter 12. In addition, a broken line represents the isolation characteristic.

The measurement result shown in FIG. 9 reveals that the duplexer according to this example has preferable attenuation characteristic and isolation characteristic at a frequency band that is outside of a passband of the transmission filter 11 and inside of the passband of the reception filter 12, namely, a higher attenuation band of the transmission filter 11, in comparison with a duplexer according to a comparative example, which will be described below.

Comparative Example

In a comparative example, the part L1 of the first interconnection 17 to be connected to the first signal output portion 26 of the transmission filter 11, the second signal input portion 30 of the reception filter 12, and the ground terminal 14 and the part L2 of the second interconnection 18 to be connected to the first ground portion 27 of the transmission filter 11 and the ground terminal 14 are arranged at an interval of 0.2 mm at a position where the extending direction of the part L1 of the first interconnection 17 does not face the extending direction of the part L2 of the second interconnection. In addition, the part L1 of the first interconnection 17 and the part L2 of the second interconnection 18 are arranged so that the direction of the current flowing through the part L1 of the first interconnection is opposite to the direction of the current flowing through the part L2 of the second interconnection. A coupling coefficient between the part L1 of the first interconnection 17 and the part L2 of the second interconnection 18 are smaller than 0.1. The configuration of the mounting substrate and the passbands of the transmission filter 11 and the reception filter 12 are the same as those employed in the above-described example.

Figure 10:
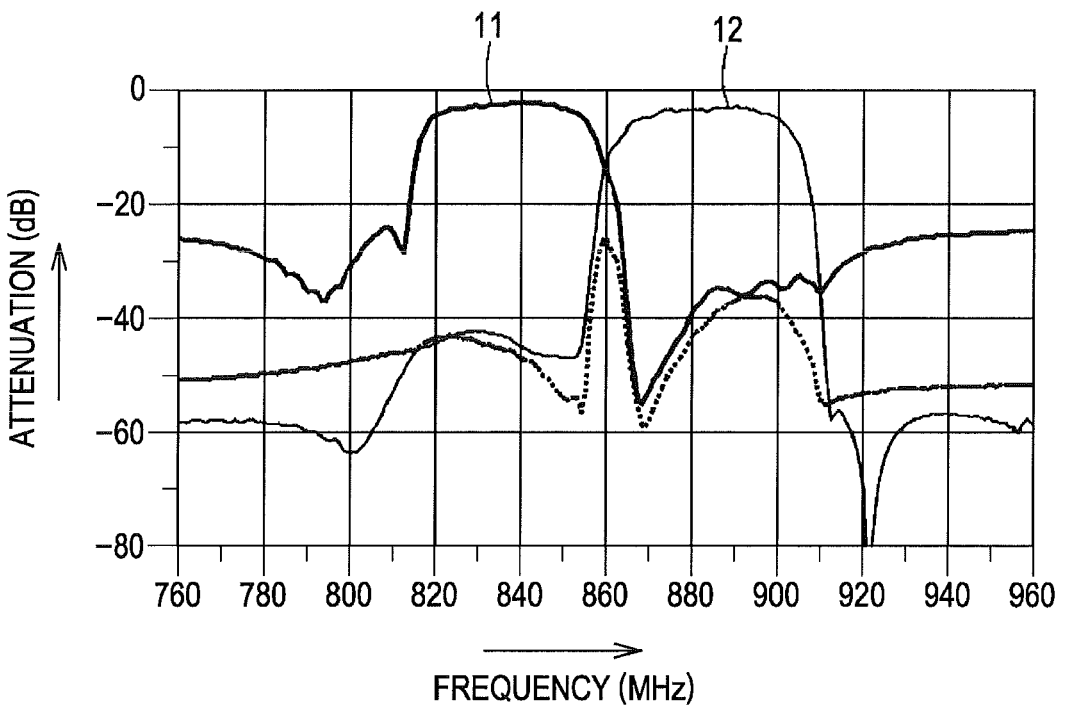
FIG. 10 is a graph showing a measurement result of an attenuation characteristic and an isolation characteristic according to a comparative example.
Figure 11:
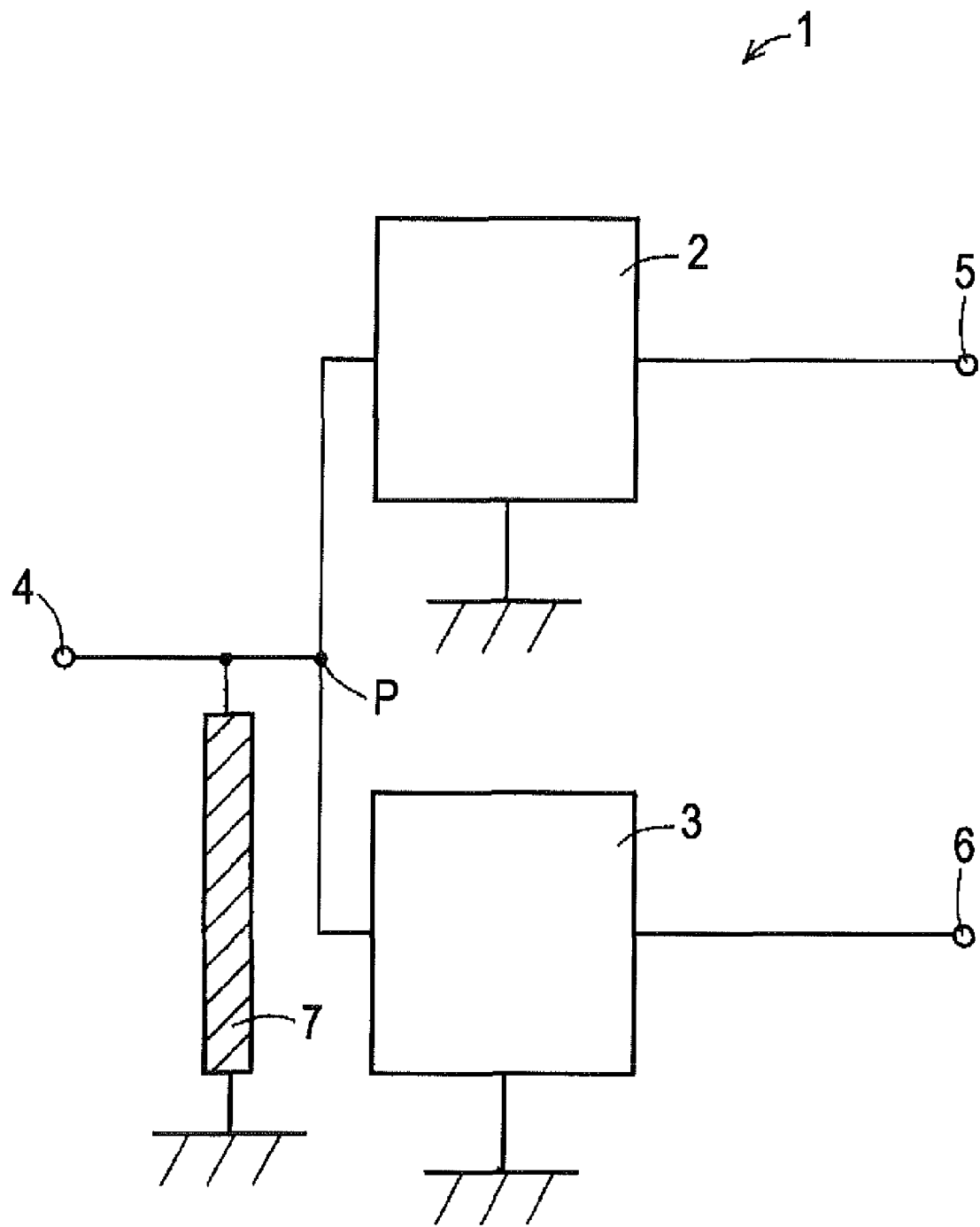
FIG. 11 is a diagram showing a configuration of a duplexer 1 according to the related art.

FIG. 10 shows a measurement result of the attenuation characteristic and the isolation characteristic obtained in the comparative example. The horizontal axis of a graph shown in FIG. 10 represents a frequency (MHz), whereas the vertical axis represents attenuation and isolation (dB). Referring to FIG. 10, a thick solid line represents the attenuation characteristic of the transmission filter 11, whereas a thin solid line represents the attenuation characteristic of the reception filter 12. In addition, a broken line represents the isolation characteristic.

The measurement result shown in FIG. 10 reveals that the duplexer according to the comparative example has inferior attenuation characteristic and isolation characteristic at a frequency band that is outside of the passband of the transmission filter 11 and inside of the passband of the reception filter 12, namely, a higher attenuation band of the transmission filter 11, in comparison with the duplexer according to the above-described example.

Table 1 shows a measurement result of attenuation and isolation at a higher attenuation band of the transmission filter 11, i.e., at 894 MHz.

TABLE 1

|  | Attenuation (dB) | Isolation (dB) |
|---|---|---|
| Example | −48.3 | −46.3 |
| Comparative Example | −35.5 | −36.2 |

As shown in Table 1, the attenuation obtained in the comparative example at the higher attenuation band of the transmission filter 11, i.e., at 894 MHz, is equal to −35.3 dB, whereas the isolation obtained in the comparative example is equal to −36.2 dB. On the other hand, the attenuation obtained in the example at the higher attenuation band of the transmission filter 11, i.e., at 894 MHz, is equal to −48.3 dB, whereas the isolation obtained in the example is equal to −46.3 dB. Accordingly, the attenuation characteristic and the isolation characteristic of this example are improved than those of the comparative example.

By implementing embodiments of the present invention, improvement in the attenuation characteristic and in the isolation characteristic at a passband of the reception filter 12, namely, at a higher non-passband frequency band of the transmission filter 11, at which improvement has been difficult, and miniaturization of the duplexer 10 can be realized at the time. The length, the width, and the thickness of the duplexer 10 according to the embodiment of the present invention are equal to 2.5 mm, 2.0 mm, and 0.8 mm, respectively.

The present invention is not limited to the above-described embodiments and various modifications can be made within a scope not departing from the spirit of the present invention. For example, although the description has been given for a case of using ladder filters as the filters in the above-described embodiments, a double mode SAW (DMS) filter and an interdigitated interdigital transducer (IIDT) filter may be used as some of the filters. More specifically, since inclusion of a parallel arm is a condition for implementation of the present invention, the configuration of the filters are not particularly restricted as long as the parallel arm is included. In addition, although the description has been given for a case of using a SAW filter in the above-described embodiments, a film bulk acoustic resonator (FBAR) filter may be used. When such DMS and IIDT filters and an FBAR filter are used, advantages similar to those of the above-described embodiments can be achieved.

The present invention can be carried out in various manners without departing from the spirit and the major features of the present invention. Accordingly, the above-described embodiments are illustrative only in every respect and the scope of the present invention is defined by the attached Claims and is not restricted by this specification. Furthermore, all of modifications and changes belonging to the scope of the attached claims are included in the scope of the present invention.

What is claimed is:

1. A duplexer comprising:
a first filter having a first signal input portion, a first signal output portion, a first ground portion connected to a parallel arm including at least one of a resonator and a capacitor, and having a predetermined passband;
a second filter having a second signal input portion, a second signal output portion and a second ground portion, and having a passband higher than the passband of the first filter;
a common terminal connected to the first signal output portion and the second signal input portion;
a first interconnection connected to the first signal output portion and the second signal input portion;
a second interconnection connected to the first ground portion; and
a ground terminal connected to the first and second interconnections and the second ground portion and to be supplied with a ground potential,
wherein the first and second interconnections are formed so that one of angles between an extending direction of part of the first interconnection and an extending direction of part of the second interconnection on a predetermined virtual plane is smaller than 90 degrees and a direction of current flow through the part of the first interconnection is opposite to a direction of current flow through the part of the second interconnection.

2. The duplexer according to claim 1, further comprising:
a multilayer interconnection substrate in which the first filter, the second filter, the common terminal, the first interconnection, the second interconnection, and the ground terminal are provided,
wherein the part of the first interconnection and the part of the second interconnection are formed on an identical layer of the multilayer interconnection substrate.

3. The duplexer according to claim 2, wherein the part of the first interconnection and the part of the second interconnection are formed on different layers of the multiplayer interconnection substrate.

4. A communication device comprising:
a duplexer according to any one of claims 1 to 3;
an antenna connected to the common terminal; and
a transmission/reception processing unit that supplies a signal to the first signal input portion and is supplied with a signal from the second signal output portion.

* * * * *